(12) United States Patent
Huang et al.

(10) Patent No.: US 9,082,789 B2
(45) Date of Patent: Jul. 14, 2015

(54) FABRICATION METHODS OF INTEGRATED SEMICONDUCTOR STRUCTURE

(75) Inventors: Chun-Hung Huang, Zhubei (TW); Yu-Hsien Lin, Hsinchu (TW); Ming-Yi Lin, Hsinchu (TW); Jyh-Huei Chen, Hsinchu (TW)

(73) Assignee: TAIWAN SEMICONDUCTOR MANUFACTURING COMPANY, LTD. (TW)

( * ) Notice: Subject to any disclaimer, the term of this patent is extended or adjusted under 35 U.S.C. 154(b) by 0 days.

(21) Appl. No.: 13/107,636

(22) Filed: May 13, 2011

(65) Prior Publication Data

US 2012/0289040 A1    Nov. 15, 2012

(51) Int. Cl.

| | |
|---|---|
| H01L 21/8234 | (2006.01) |
| H01L 29/66 | (2006.01) |
| H01L 21/8238 | (2006.01) |
| H01L 29/165 | (2006.01) |
| H01L 29/78 | (2006.01) |
| H01L 21/28 | (2006.01) |
| H01L 29/49 | (2006.01) |
| H01L 29/51 | (2006.01) |

(52) U.S. Cl.
CPC .. *H01L 29/66545* (2013.01); *H01L 21/823842* (2013.01); *H01L 21/823857* (2013.01); *H01L 29/165* (2013.01); *H01L 29/6659* (2013.01); *H01L 29/66636* (2013.01); *H01L 29/7833* (2013.01); *H01L 21/28185* (2013.01); *H01L 21/28202* (2013.01); *H01L 29/4966* (2013.01); *H01L 29/513* (2013.01); *H01L 29/517* (2013.01); *H01L 29/518* (2013.01)

(58) Field of Classification Search
CPC .............. H01L 21/823857; H01L 21/823462; H01L 21/28185; H01L 29/66545; H01L 29/518
USPC .................................................. 438/142–308
See application file for complete search history.

(56) References Cited

U.S. PATENT DOCUMENTS

| | | | | |
|---|---|---|---|---|
| 3,853,633 | A * | 12/1974 | Armstrong | 438/217 |
| 6,080,682 | A * | 6/2000 | Ibok | 438/770 |
| 7,045,847 | B2 * | 5/2006 | Lin et al. | 257/310 |
| 7,183,184 | B2 * | 2/2007 | Doczy et al. | 438/585 |
| 2001/0021588 | A1 * | 9/2001 | Misium et al. | 438/762 |
| 2004/0082144 | A1 * | 4/2004 | Park et al. | 438/435 |
| 2005/0014352 | A1 * | 1/2005 | Torii et al. | 438/591 |
| 2005/0153493 | A1 * | 7/2005 | Lee | 438/195 |
| 2009/0104742 | A1 * | 4/2009 | Pas | 438/230 |
| 2009/0170339 | A1 * | 7/2009 | Trentzsch et al. | 438/765 |
| 2012/0225545 | A1 * | 9/2012 | Fu et al. | 438/585 |

FOREIGN PATENT DOCUMENTS

| | | |
|---|---|---|
| TW | 200504814 | 2/2005 |
| TW | 200520237 | 6/2005 |

OTHER PUBLICATIONS

Office Action dated Nov. 21, 2013 from corresponding application No. TW 100138539.

* cited by examiner

*Primary Examiner* — Mark Tornow
*Assistant Examiner* — Abbigale Boyle
(74) *Attorney, Agent, or Firm* — Lowe Hauptman & Ham, LLP

(57) ABSTRACT

An integrated circuit device and method for manufacturing an integrated circuit device is disclosed. The integrated circuit device comprises a core device and an input/output circuit. Each of the core device and input/output circuit includes a PMOS structure and an NMOS structure. Each of the PMOS includes a p-type metallic work function layer over a high-k dielectric layer, and each of the NMOS structure includes an n-type metallic work function layer over a high-k dielectric layer. There is an oxide layer under the high-k dielectric layer in the input/output circuit.

20 Claims, 12 Drawing Sheets

FABRICATION METHODS OF INTEGRATED SEMICONDUCTOR STRUCTURE

FIELD

The present disclosure relates generally to the field of semiconductor devices and, more particularly, to metal gate transistors, integrated circuits, systems, and fabrication methods thereof.

BACKGROUND

The semiconductor integrated circuit (IC) industry has experienced rapid growth. Technological advances in IC materials and design have produced generations of ICs where each generation has smaller and more complex circuits than the previous generation. However, these advances have increased the complexity of processing and manufacturing ICs and, for these advances to be realized, similar developments in IC processing and manufacturing are needed.

In the course of IC evolution, functional density (i.e., the number of interconnected devices per chip area) has generally increased while geometry size (i.e., the smallest component (or line) that can be created using a fabrication process) has decreased. This scaling down process generally provides benefits by increasing production efficiency and lowering associated costs. Such scaling-down also produces a relatively high power dissipation value, which may be addressed by using low power dissipation devices such as complementary metal-oxide-semiconductor (CMOS) devices.

During the scaling trend, various materials have been implemented for the gate electrode and gate dielectric for CMOS devices. CMOS devices have typically been formed with a gate oxide and polysilicon gate electrode. There has been a desire to replace the gate oxide and polysilicon gate electrode with a high-k gate dielectric and metal gate electrode to improve device performance as feature sizes continue to decrease.

BRIEF DESCRIPTION OF THE DRAWINGS

The present disclosure is best understood from the following detailed description when read with the accompanying figures. It is emphasized that, in accordance with the standard practice in the industry, various features are not drawn to scale and are used for illustration purposes only. In fact, the dimensions of the various features may be arbitrarily increased or reduced for clarity of discussion.

DETAILED DESCRIPTION

Figure 1:
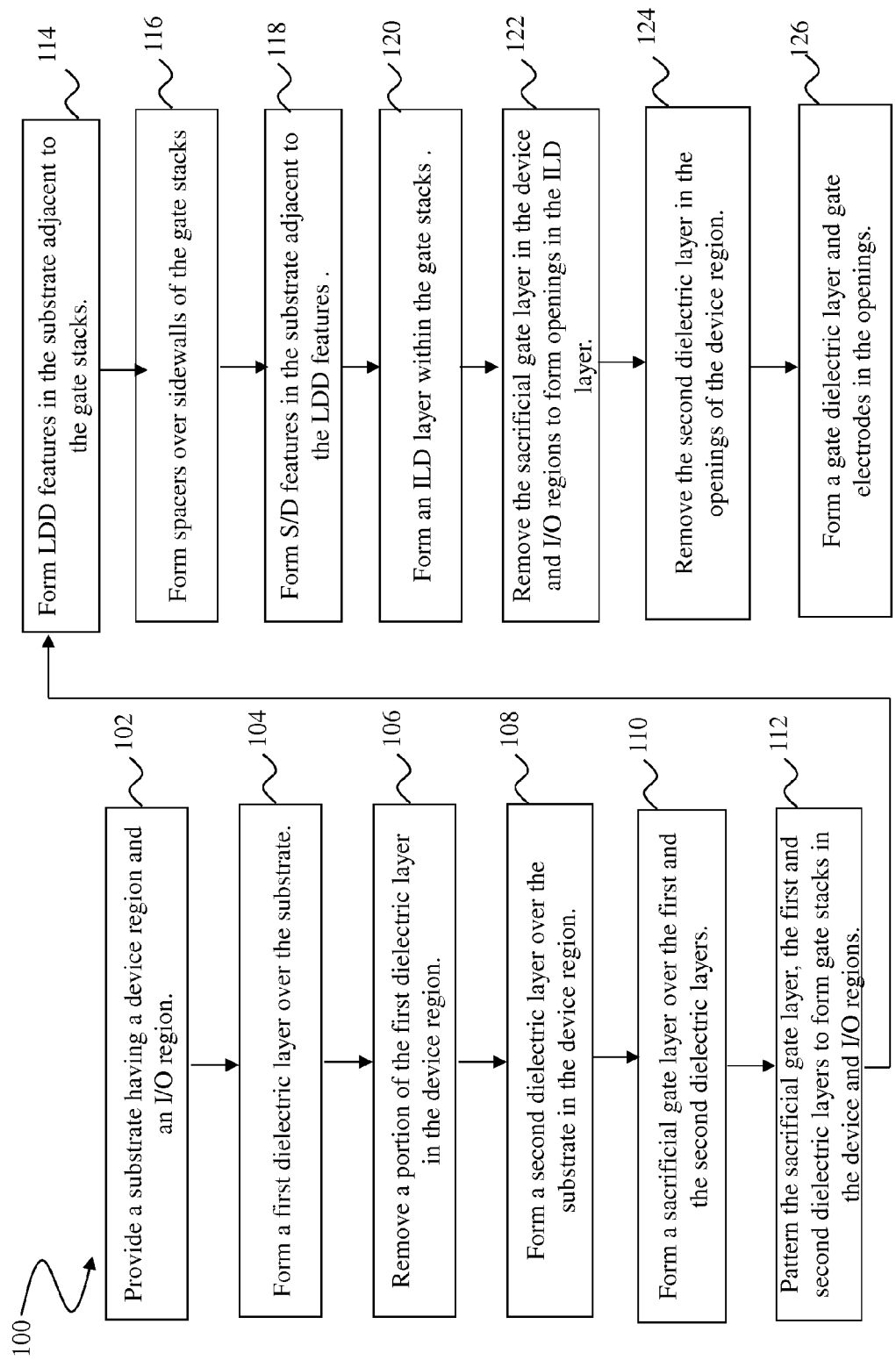
FIG. 1 is a flow chart of a method for fabricating an integrated circuit device according to an embodiment of the present disclosure.

It is understood that the following disclosure provides many different embodiments, or examples, for implementing different features. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

With reference to FIGS. 1 and 2-12, a method 100 and a semiconductor device 200 are collectively described below. The semiconductor device 200 illustrates an integrated circuit, or portion thereof, that can comprise memory cells and/or logic circuits. The semiconductor device 200 can include passive components such as resistors, capacitors, inductors, and/or fuses; and active components, such as P-channel field effect transistors (PFETs), N-channel field effect transistors (NFETs), metal-oxide-semiconductor field effect transistors (MOSFETs), complementary metal-oxide-semiconductor transistors (CMOSs), high voltage transistors, and/or high frequency transistors, other suitable components, and/or combinations thereof. It is understood that additional steps can be provided before, during, and/or after the method 100, and some of the steps described below can be replaced or eliminated, for additional embodiments of the method. It is further understood that additional features can be added in the semiconductor device 200, and some of the features described below can be replaced or eliminated, for additional embodiments of the semiconductor device 200.

Figure 2:
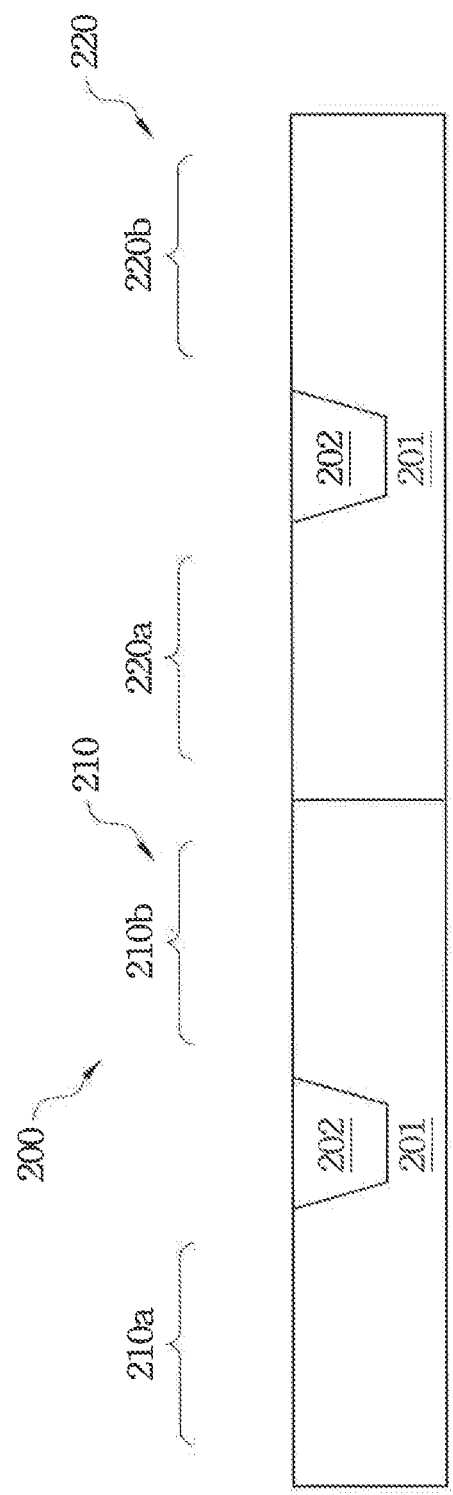
FIGS. 2-12 are various diagrammatic cross-sectional views of an embodiment of an integrated circuit device during various fabrication stages according to the method of FIG. 1.

Referring to FIGS. 1 and 2, the method 100 begins at step 102, wherein a substrate 201 is provided. In the present embodiment, the substrate 201 is a semiconductor substrate comprising silicon. Alternatively, the substrate 201 comprises an elementary semiconductor including silicon and/or germanium in crystal; a compound semiconductor including silicon carbide, gallium arsenide, gallium phosphide, indium phosphide, indium arsenide, and/or indium antimonide; an alloy semiconductor including SiGe, GaAsP, AlInAs, AlGaAs, GaInAs, GaInP, and/or GaInAsP; or combinations thereof. The alloy semiconductor substrate may have a gradient SiGe feature in which the Si and Ge composition change from one ratio at one location to another ratio at another location of the gradient SiGe feature. The alloy SiGe may be formed over a silicon substrate. The SiGe substrate may be strained. Furthermore, the semiconductor substrate may be a semiconductor on insulator (SOI). In some examples, the semiconductor substrate may include a doped epi layer. In other examples, the silicon substrate may include a multilayer compound semiconductor structure.

The substrate 201 may include various doped regions depending on design requirements (e.g., p-type wells or n-type wells). The doped regions may be doped with p-type dopants, such as boron or $BF_2$; n-type dopants, such as phosphorus or arsenic; or a combination thereof. The doped regions may be formed directly in the substrate 201, in a P-well structure, in an N-well structure, in a dual-well structure, or using a raised structure. The semiconductor device 200 may include a PFET device and/or a NFET device, and thus, the substrate 201 may include various doped regions configured for the PFET device and/or the NFET device.

The substrate 201 may include a device region 210 and an input/output (I/O) region 220. The device region 210 is preserved for forming a core device therein and the region 220 is preserved for forming an I/O circuit therein. The device region 210 includes a N-type transistor (NMOS) device 210*a* and a P-type transistor (PMOS) device 210*1*), and the I/O region includes a N-type transistor (NMOS) device 220*a* and a P-type transistor (PMOS) device 220*h*, over the substrate 201.

Shallow trench isolation (STI) structures 202 are formed in the substrate 201. The STI structure 202 comprises silicon oxide, silicon nitride, silicon oxynitride, other suitable materials, or combinations thereof. As one example, forming the STI structure 202 includes an etching process to form a trench in the substrate 201, and filling the trench with one or more dielectric materials. In some examples, the filled trench may have a multi-layered structure, such as a thermal oxide liner layer filled with silicon nitride or silicon oxide.

Figure 3:
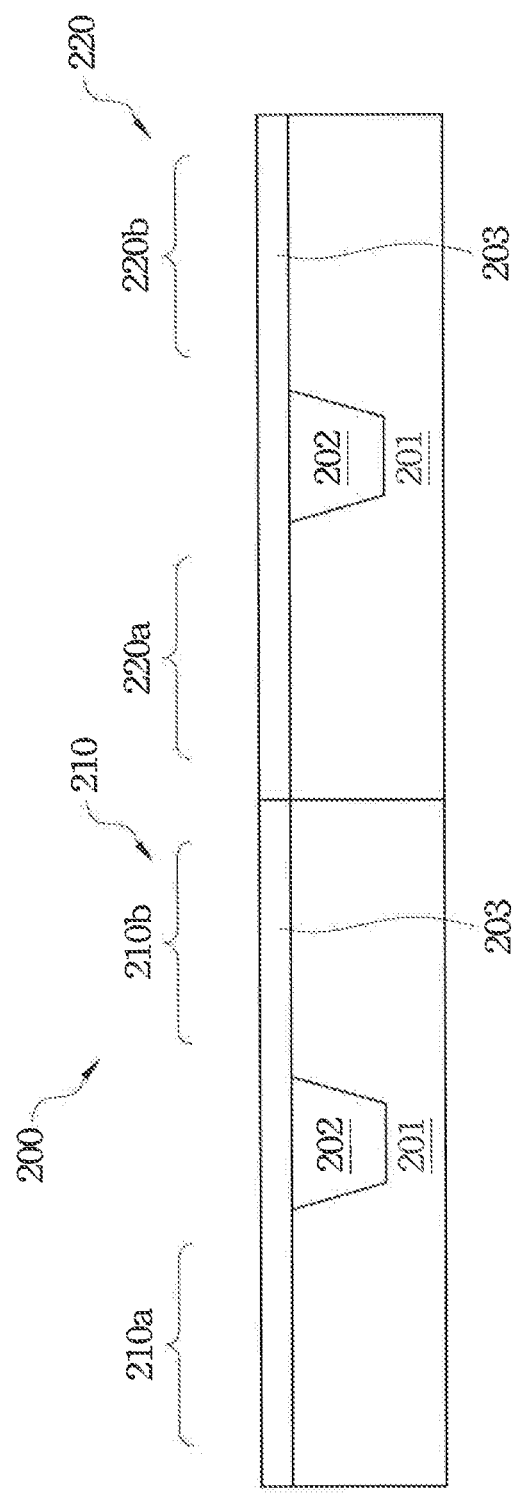

Referring to FIGS. 1 and 3, the method 100 continues with step 104 in which a first dielectric layer 203 is formed over the substrate 201 and the STI structures 202. The first dielectric layer 203 comprises a first material with a first thickness. In at least one embodiment, the first material comprises silicon oxide, silicon oxynitride, silicon nitride, or combinations thereof. In other embodiments, the first material is silicon oxide. In some embodiments, the first thickness ranges between about 30 Angstroms and about 50 Angstroms.

Figure 4:
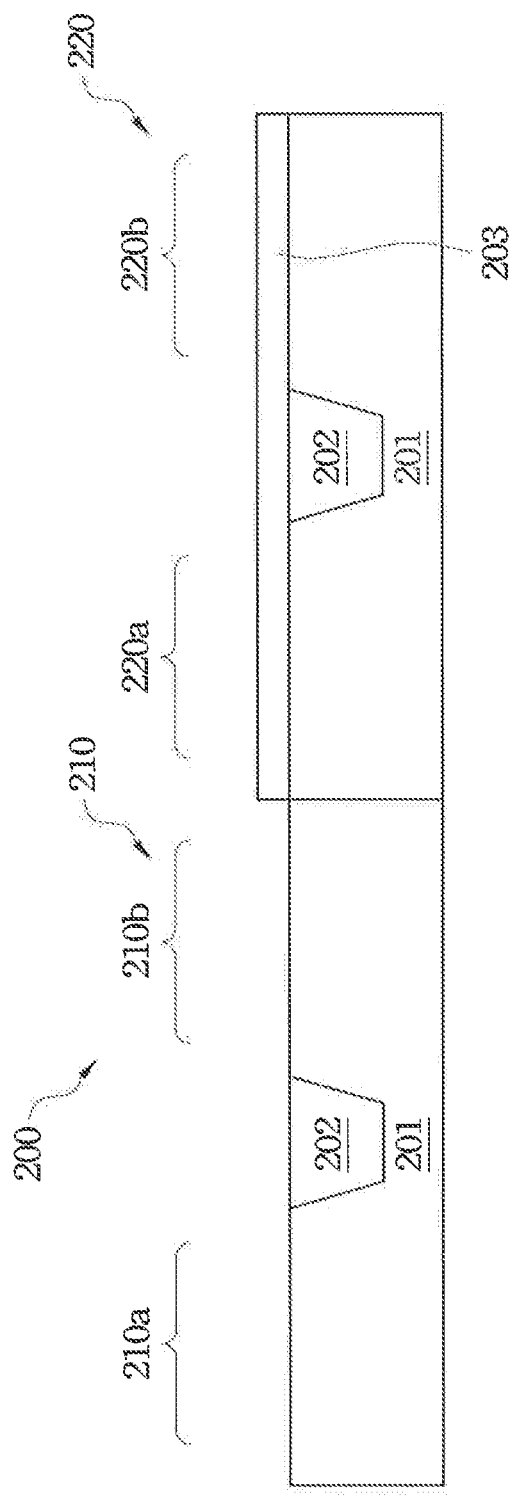

Referring to FIGS. 1 and 4, the method 100 continues with step 106 in which at least a portion of the first dielectric layer 203 in the device region 210 is removed. Thereafter, a surface of the substrate 201 underlying the removed first dielectric layer 203 is exposed. In at least one embodiment, the first dielectric layer 203 is removed by a dry etching and/or wet etching process. In other embodiments, the first dielectric layer 203 is removed using a dilute HF solution at room temperature, wherein the ratio of HF to de-ionized water in the dilute HF solution is about 1:50. A protector (not shown), e.g., photoresist or hard mask layer, may be formed over the first dielectric layer 203 in the I/O region 220 to protect it from being removed during the removing step.

Figure 5:
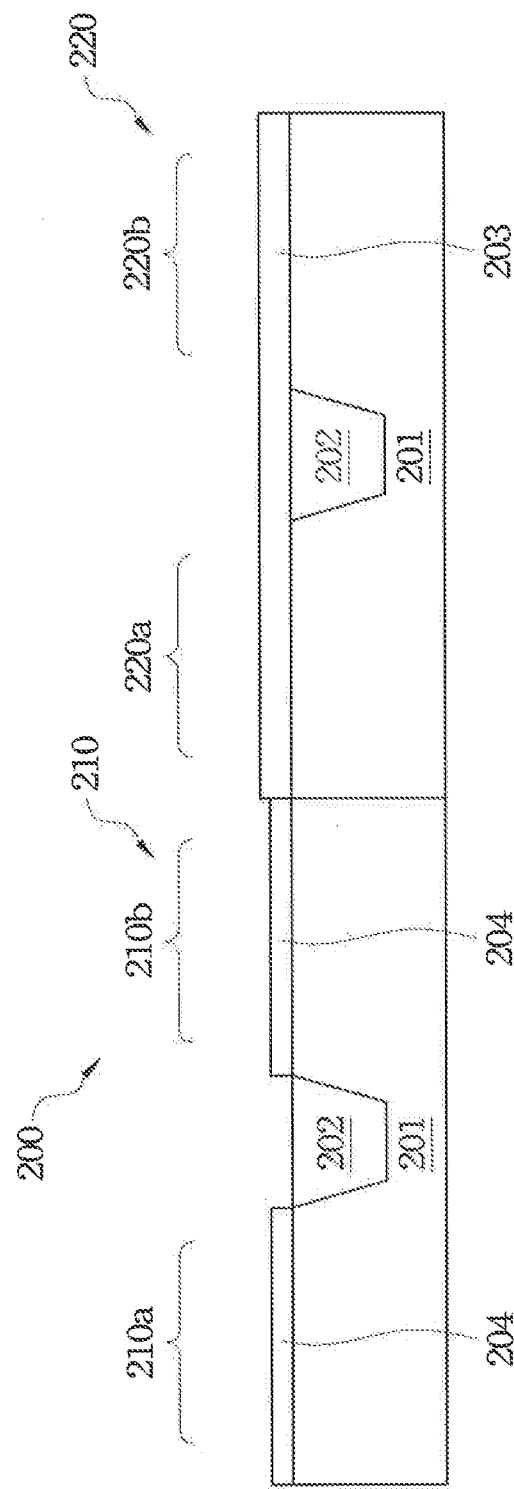

Referring to FIGS. 1 and 5, the method 100 continues with step 108 in which a second dielectric layer 204 is formed over the substrate 201 in the device region 210. The second dielectric layer 204 comprises a second material with a second thickness. In some embodiments, the second material is different from the first material. In at least one embodiment, the second material comprises silicon oxide, silicon oxynitride, silicon nitride, or combinations thereof. In other embodiments, the second material is silicon nitride. In some embodiments, the second thickness is different from the first thickness. In at least one embodiment, the second thickness is less than the first thickness. In other embodiments, the second thickness ranges between about 8 Angstroms and about 15 Angstroms.

The second dielectric layer 204, in some embodiments, is selectively formed over regions with exposed surface of the substrate 201. For example, the second dielectric layer 204 is formed on the substrate 201 in the device region 210 because the surface of the substrate 201 in the device region 210 is exposed. For example, the second dielectric layer 204 is not formed on the substrate 201 in the I/O region 220 because the surface of the substrate 201 in the I/O region 220 is capped by the first dielectric layer 203. In at least one embodiment, the second dielectric layer 204 is formed using a thermal process, comprising furnace process, rapid thermal annealing (RTA) process, and/or in-situ steam generation (ISSG) process. In some embodiments, the thermal process is performed using a nitrogen-containing gas, e.g., NH3, N2, or the combination thereof. In at least one embodiment, the thermal process is performed at a temperature ranging between about 300° C. and about 700° C. In other embodiments, the thermal process is performed under a pressure ranging between about 0.1 mTorr and about 10 mTorr.

An annealing process may be provided after forming the second dielectric layer 204. In at least one embodiment, the annealing process is performed with oxygen gas. In other embodiments, the annealing process is performed using a gas mixture of $O_2$ and $N_2$. In some embodiments, the annealing process is performed at a temperature ranging between about 500° C. and about 800° C. and under a pressure ranging between about 0.1 mTorr and about 1 Torr. The annealing process may form an oxide layer (not shown) between the second dielectric layer 204 and the substrate 201 in the device region 210, thereby improving roughness of the interface between the second dielectric layer 204 and the substrate 201.

Figure 6:
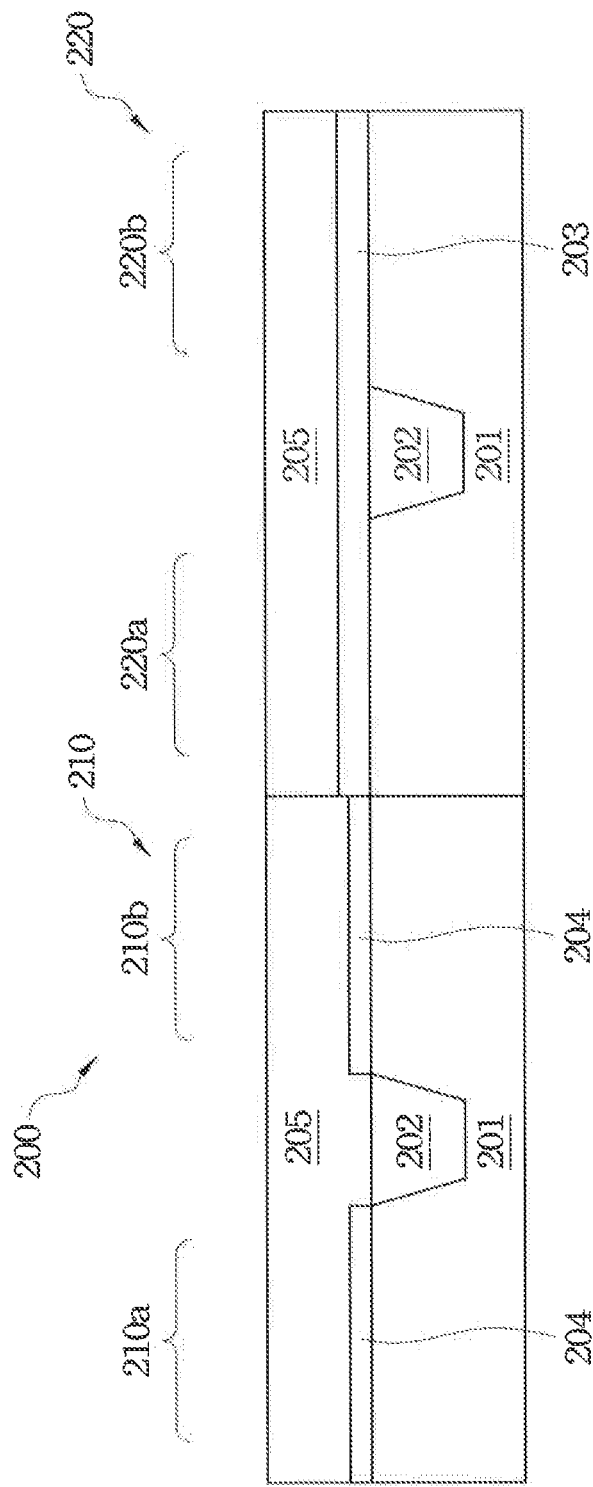

Referring to FIGS. 1 and 6, the method 100 continues with step 110 in which a sacrificial gate layer 205 is formed over the first dielectric layer 203 and the second dielectric layer 204. In some embodiments, the sacrificial gate layer 205 is a polycrystalline silicon (polysilicon) layer. The polysilicon layer may be doped for proper conductivity. Alternatively, the polysilicon is not necessarily doped if a sacrificial gate is to be formed and replaced in a subsequent gate replacement process. Alternatively, the sacrificial gate layer 205 is amorphous silicon or other material that has a desired etch rate with respect to the underlying first and second dielectric layers 203, 204, and spacers formed subsequently. The sacrificial gate layer 205 can be formed by deposition, including chemical vapor deposition (CVD), atomic layer deposition (ALD), other suitable methods, and/or combinations thereof.

Figure 7:
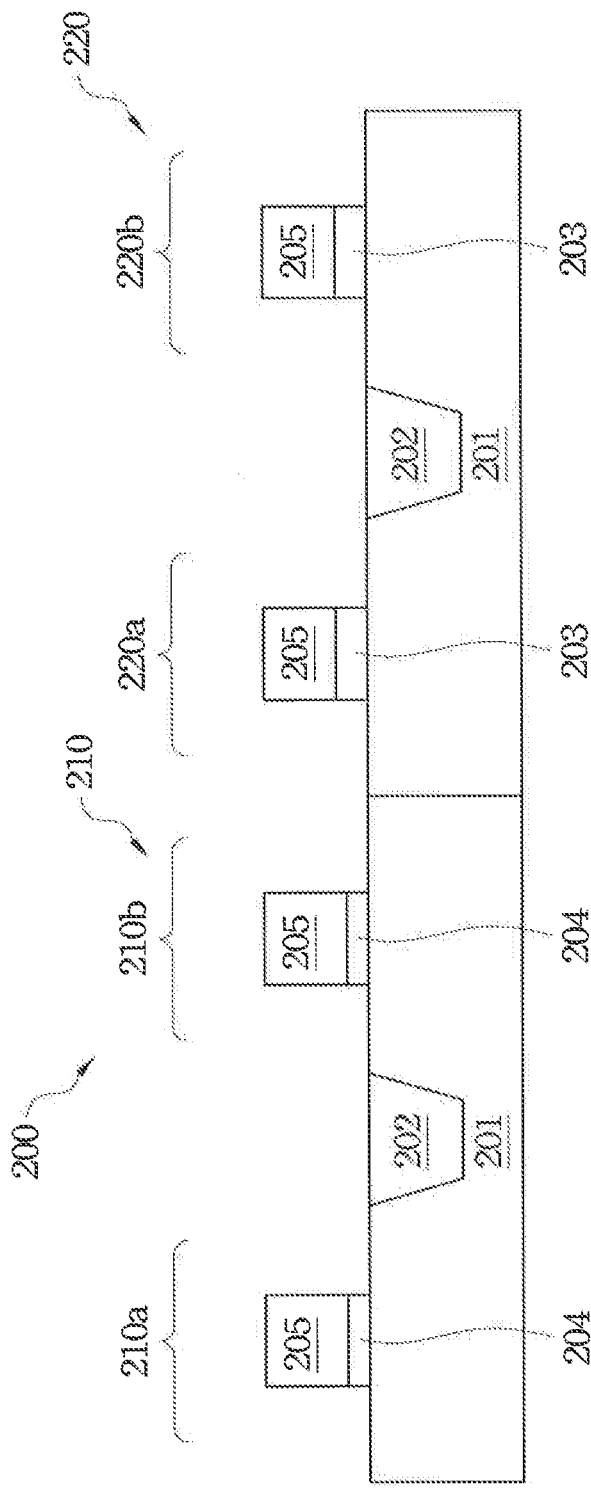

Referring to FIGS. 1 and 7, the method 100 continues with step 112 in which a patterning process is applied to the sacrificial gate layer 205 and the underlying first and second dielectric layers 203, 204. The patterned sacrificial gate layer 205 and the underlying first dielectric layer 203 form gate stacks for the NMOS device 220a and PMOS device 220b in the I/O region 220. The patterned sacrificial gate layer 205 and the underlying second dielectric layer 204 form gate stacks for the NMOS device 210a and PMOS device 210b in the device region 210. The patterning process, for example, includes forming a layer of photoresist (not shown) over the sacrificial gate layer 205 by a suitable process, such as spin-on coating, and then exposing and developing the layer of photoresist to form a photoresist feature. Then, pattern of the photoresist feature can be transferred to the underlying sacrificial gate layer 205, the first dielectric layer 203, and the second dielectric layer 204 to form the gate stacks by a dry etching process. Additionally, an anti-reflective coating (ARC) layer (not shown) may be formed under the layer of photoresist to enhance a subsequent patterning process as known in the art. The photoresist feature may be stripped thereafter. It is understood that the above examples do not limit the processing steps that may be utilized to form the gate stacks.

Figure 8:
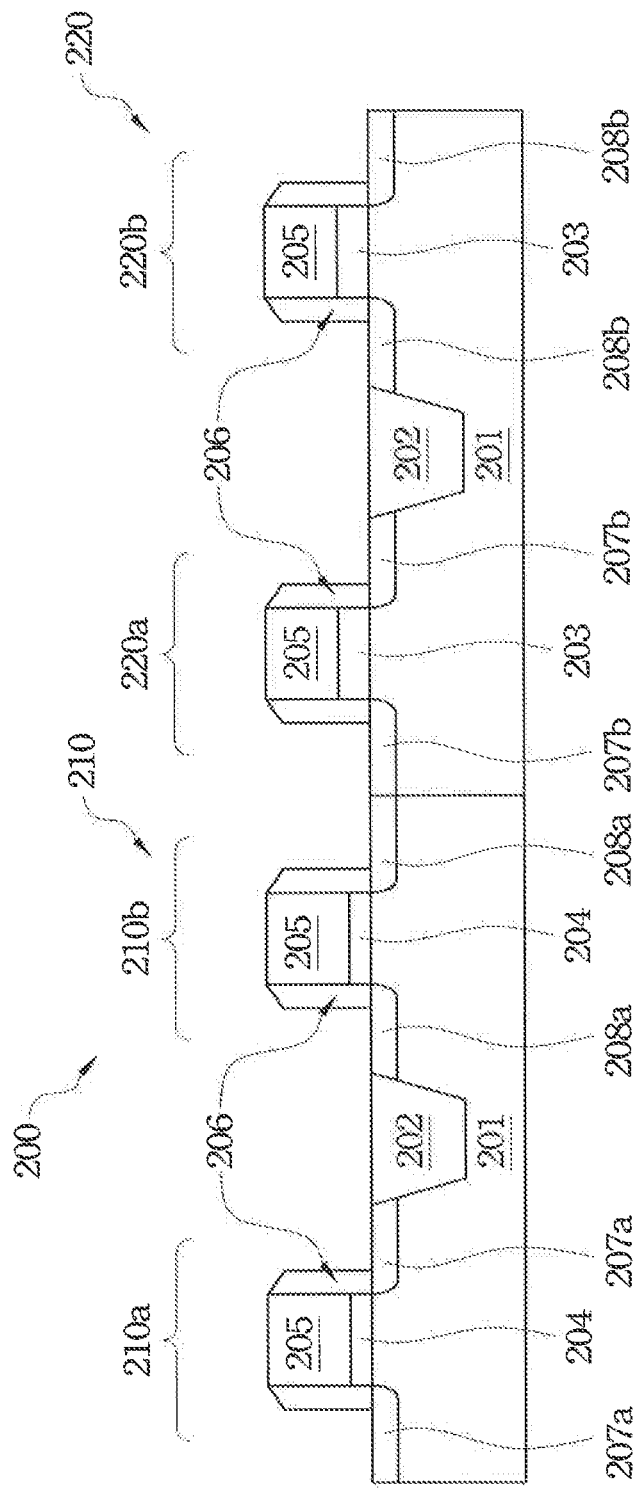

Referring to FIGS. 1 and 8, the method 100 continues with step 114 in which N-type lightly doped source/drain (NLDD) regions 207a, 207b and P-type lightly doped source/drain (PLDD) regions 208a, 208h are formed in the substrate 201. The NLDD regions 207a and 207b are substantially aligned with edges of the gate stacks for the NMOS devices 210a and 220a, respectively. The region in the substrate 201 and between the NLDD regions 207a is identified as a channel of the gate stack for the NMOS devices 210a, and the region in the substrate 201 and between the NLDD regions 207b is identified as a channel of the gate stack for the NMOS devices 220a. The PLDD regions 208a and 208h are substantially aligned with edges of the gate stacks for the PMOS devices 210b and 220b, respectively. The region in the substrate 201 and between the PLDD regions 208a is identified as a channel of the gate stack for the PMOS devices 210b, and the region in the substrate 201 and between the PLDD regions 208h is identified as a channel of the gate stack for the PMOS devices 220b.

The NLDD regions 207a, 207b and PLDD regions 208a, 208b may be formed by ion implantation, plasma-based ion implantation, gaseous or solid source thermal diffusion, deposition, or combinations thereof. In at least one embodiment, the NLDD regions 207a, 207b are doped with an N-type dopant, such as phosphorous and/or arsenic. In another embodiment, the PLDD regions 208a, 208h are doped with a P-type dopant, such as boron and/or $BF_2$.

Still referring to FIGS. 1 and 8, the method 100 continues with step 116 in which spacers 206 are formed overlying sidewalls of the gate stacks of the NMOS devices 210a, 220a and the PMOS devices 210b, 220b. In some embodiments, spacers 206 may be formed by blanket depositing a dielectric spacer layer (not shown), such as a silicon nitride layer, over the NMOS devices 210a, 220a and the PMOS devices 210b, 220b, and then the dielectric layer is anisotropically etched to form the spacers 206. Alternatively, liners (not shown) may be included under the spacers 206 by forming a dielectric liner layer, e.g., a silicon oxide layer, under the spacer layer, and then the spacer layer and the liner layer are etched in sequence to form the spacers 206 and the underlying liners. In still other embodiments, the spacers 206 may include other dielectric materials, such as silicon oxide, silicon oxynitride, or combinations thereof.

Figure 9:
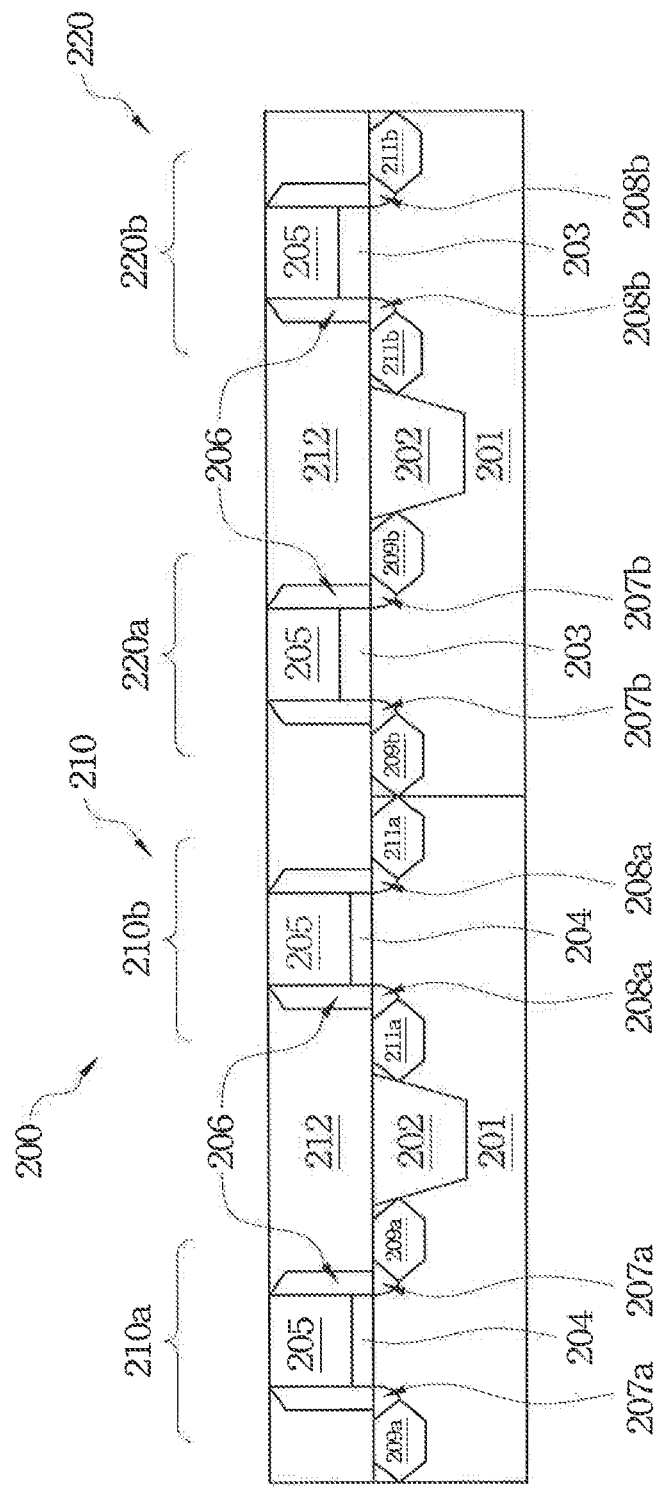

Referring to FIGS. 1 and 9, the method 100 continues with step 118 in which source/drain (S/D) regions 209a, 209b, 211a, and 211b are formed in the substrate 201. In some embodiments, each of the S/D regions 209a, 209b is formed adjacent to the NLDD regions 207a, 207b, respectively, and each of the S/D regions 211a, 211b is formed adjacent to PLDD regions 208a, 208b, respectively. In some embodiments, the S/D regions 209a, 209b, 211a, and 211b can include silicide (not shown) thereon for low resistances.

In some embodiments, the S/D regions 209a, 209h are n-type S/D regions comprising dopants such as Arsenic (As), Phosphorus (P), other group V element, or the combinations thereof. The S/D regions 209a, 209h may be formed by performing one or more implantation processes to the substrate 201, or filling epitaxially features in the substrate 201. In the depicted embodiment, the S/D regions 209a, 209b include epitaxially grown silicon (epi Si) features. The epi Si S/D features may be in-situ doped or undoped during the epi process. For example, the epi Si S/D features may be doped with phosphorous to form Si:P S/D features or doped with carbon to form Si:C S/D features. In some embodiments, the S/D regions 211a, 211b is p-type S/D regions comprising dopants such as Boron (B) or other group III elements. In the depicted embodiment, the S/D regions 211a, 211b include silicon germanium (SiGe) S/D features formed by an epi process. The SiGe S/D features may be in-situ doped or undoped during the epi process.

When the S/D features are undoped, it is understood that they may be doped in a subsequent process. The doping may be achieved by an ion implantation process, plasma immersion ion implantation (PIII) process, gas and/or solid source diffusion process, other suitable process, or combinations thereof. The S/D features may further be exposed to annealing processes, such as a rapid thermal annealing process.

Still referring to FIGS. 1 and 9, the method 100 continues with step 120 in which an interlayer dielectric (ILD) layer 212 is filled in the space within and over the gate stacks for the NMOS device 210a, PMOS device 210b, NMOS device 220a, and PMOS device 220h. In some embodiments, a chemical mechanical polishing (CMP) process is further applied to planarize the ILD layer 212. Further, a contact etch stop layer (CESL) (not shown) may be formed before forming the ILD layer. In some embodiments, the ILD layer 212 is a dielectric layer comprising materials such as oxide, nitride, oxynitride, low-k dielectric material, ultra low-k dielectric material, extreme low-k dielectric material, other dielectric material, and/or combinations thereof. The ILD layer 212 may be formed by, for example, a CVD process, a high-density plasma (HDP) CVD process, a high-aspect ratio profiling (HARP) process, a spin-coating process, other deposition process, and/or any combinations thereof. In some embodiments, additional dielectric layer (not shown) can be formed below or over the HA) layer 212.

Figure 10:
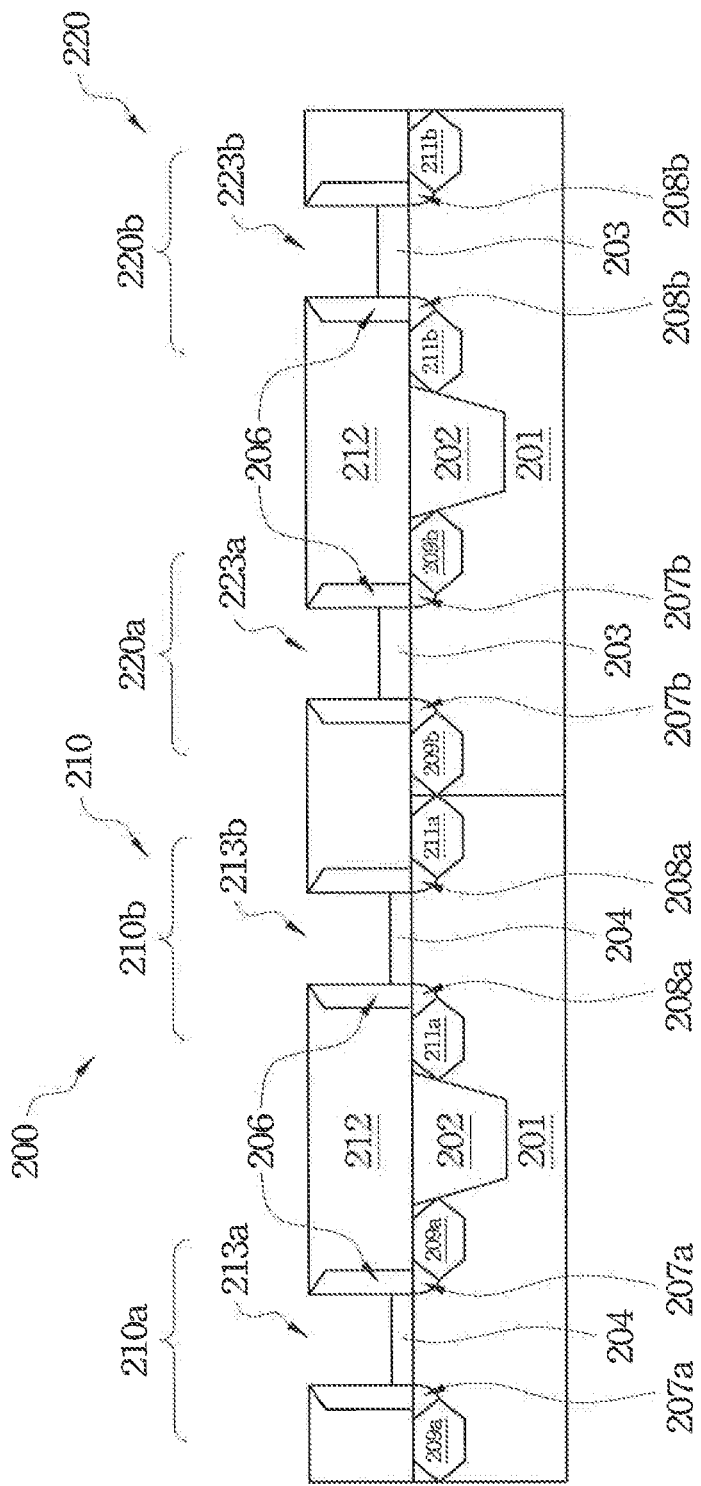
Figure 11:
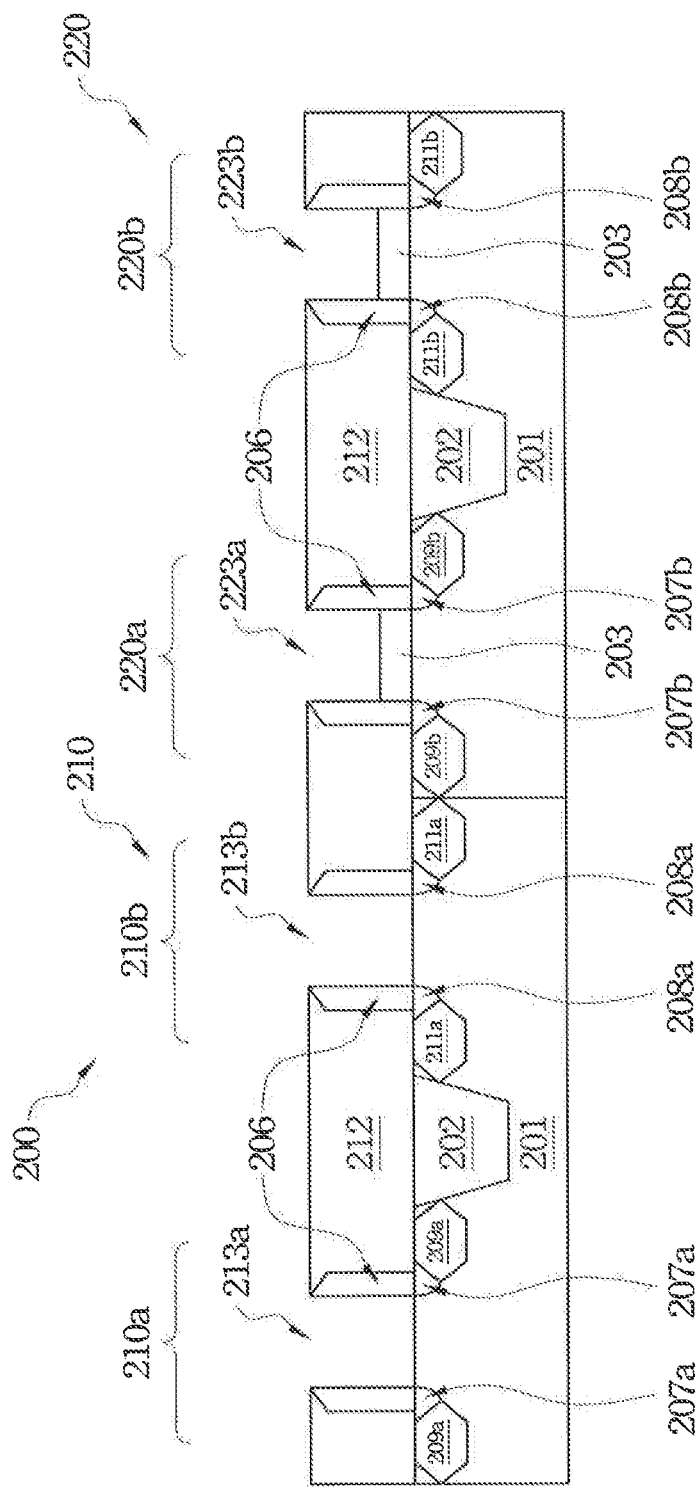
Figure 12:
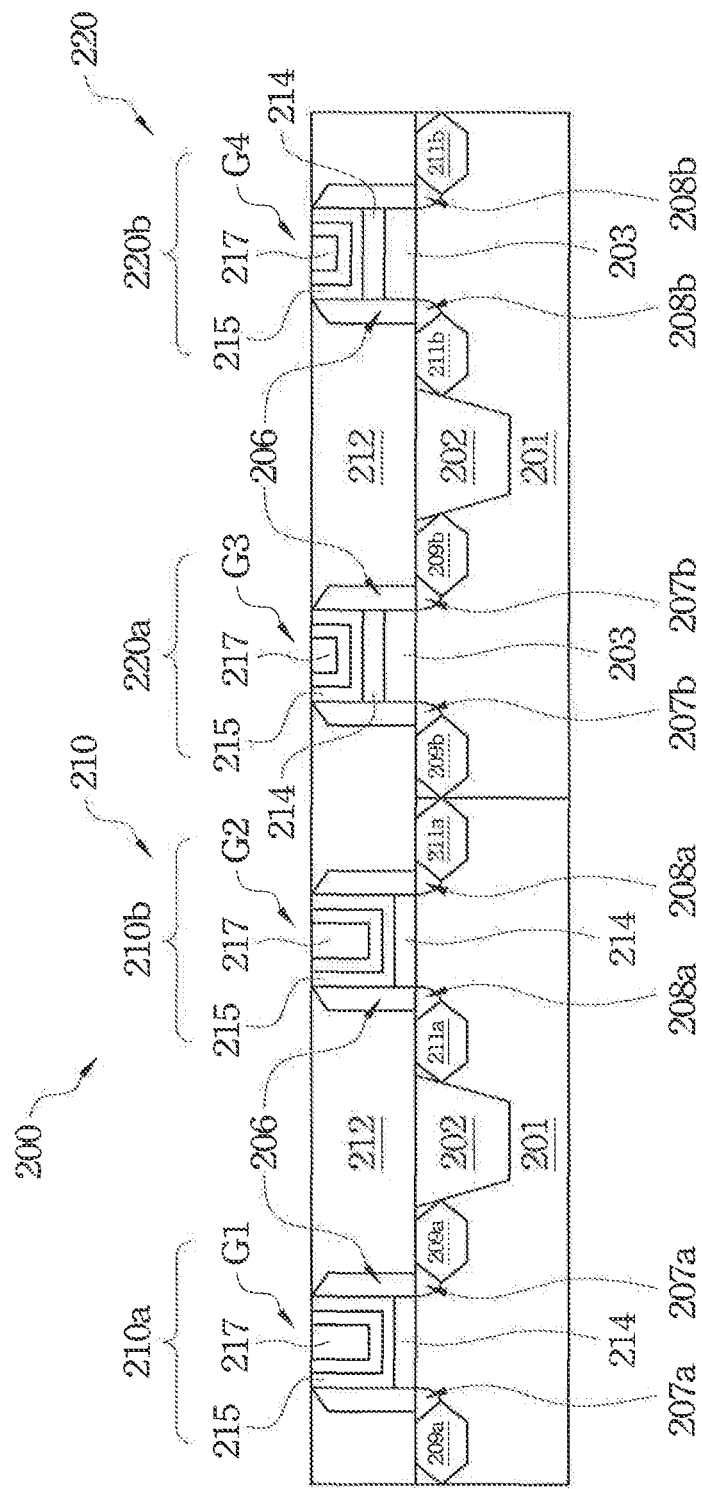

FIGS. 10-12 illustrate gate replacement processes for forming a subsequent high-k gate dielectric and metal gate electrode. The depicted processes are referred to as a gate-last technique which forms the metal gate electrode after the formation of source/drain regions of the transistors.

Referring to FIGS. 1 and 10, the method 100 continues with step 122 in which the sacrificial gate layer 205 is removed from the gate stacks for the NMOS devices 210a, PMOS device 210b in the device region 210, and NMOS devices 220a, PMOS device 220b in the I/O region 220. The removing step forms openings 213a, 213h in the ILD layer 212 of the device region 210, and forms openings 223a, 223b in the ILD layer 212 of the I/O region 220. The first dielectric layer 203 in the openings 223a, 223b and the second dielectric layer 204 in the openings 213a, 213b are then exposed after removing the sacrificial gate layer 205. In some embodiments, the removing process comprises a dry and/or wet etching process. In the depicted embodiment, the removing process is performed using a chemical of dilute Ammonia solution under a temperature of about 45° C. The dilute Ammonia solution, for example, has a ratio of $NH_4OH$ to de-ionized water being about 1:5.

Referring to FIGS. 1 and 11, the method 100 continues with step 124 in which the second dielectric layer 204 in the openings 213a, 213b of the device region 210 is removed. The removing process may comprise a wet etching and/or a dry etching process. In at least one embodiment, the removing process is a wet etching process using phosphoric acid solution. The phosphoric acid solution may comprise phosphoric acid and de-ionized water with a concentration ranging about 95% and about 100%. The wet etching process, for example, is performed at a temperature ranging between about 140° C. and about 180° C. In another embodiment, the removing process is a dry etching process using CFx gas, such as $CF_3$ and/or $CF_4$. A wet cleaning process, e.g., diluted HF (DHF), may be applied after the dry etching process to remove polymers resulted from the dry etching process.

A high etching selectivity is achieved between the second dielectric layer 204 and the first dielectric layer 203 because the second dielectric layer 204 has the second material different from the first material of the first dielectric layer 203. The etching selectivity between the second dielectric layer 204 and the first dielectric layer 203, for example, ranges between about 80 and about 100. In some embodiments, it is unnecessary to provide a protector over the first dielectric layer 203 in the openings 223a, 223b of the I/O region 220 during removing the second dielectric layer 204 in the openings 213a, 213b of the device region 210. In some embodiments, the first dielectric layer 203 in the openings 223a, 223b of the I/O region 220 is not substantially removed during removal of the second dielectric layer 204 in the openings 213a, 213b of the device region 210. Hence, damage to the first dielectric layer 203 can be prevented and the first thickness of first dielectric layer 203 can be controlled precisely during the etching process.

Referring to FIGS. 1 and 12, the method 100 continues with step 126 in which a gate dielectric layer 214 is formed in the openings 213a, 213b, 223a, and 223b. In the device region 210, the gate dielectric 214 is formed over the substrate 201. In the I/O region 220, the gate dielectric 214 is formed over the first dielectric layer 203. Gate electrodes G1 and G2 may be formed over the gate dielectric 214 for the NMOS device 210a and the PMOS device 210b, respectively, in the device region 210. Gate electrodes G3 and G4 may be formed over the gate dielectric 214 for the NMOS device 220a and the PMOS device 220b, respectively, in the I/O region 210.

In some embodiments, the gate dielectric layer 214 is a high-k dielectric layer disposed over an interfacial layer (not shown). In some embodiments, the gate dielectric layer 214 may include hafnium oxide ($HfO_2$), hafnium silicon oxide (HfSiO), hafnium silicon oxynitride (HfSiON), hafnium tantalum oxide ($HfO_2$), hafnium titanium oxide (HfTiO), hafnium zirconium oxide (HfZrO), other suitable high-k dielectric materials, and/or combinations thereof. The gate dielectric layer 214 may further be selected from metal oxides, metal nitrides, metal silicates, transition metal-oxides, transition metal-nitrides, transition metal-silicates, oxynitrides of metals, metal aluminates, zirconium silicate, zirconium aluminate, silicon oxide, silicon nitride, silicon oxynitride, zirconium oxide, titanium oxide, aluminum oxide, hafnium dioxide-alumina ($HfO_2$—$Al_2O_3$) alloy, other suitable materials, and/or combinations thereof. The gate dielectric layer 214 may be formed by any suitable process, such as atomic layer deposition (ALD), chemical vapor deposition (CVD), physical vapor deposition (PVD), remote plasma CVD (RPCVD), plasma enhanced CVD (PECVD), metal organic CND (MOCVD), sputtering, plating, other suitable processes, and/or combinations thereof.

In some embodiments, the gate electrodes G1, G2, G3, and G4 are metal gates. In some embodiments, the gate electrodes G1, G3 include a first work function metallic layer 215 and the first work function metallic layer 215 is configured to adjust a work function value of the gate electrodes G1, G3. The first work function metallic layer 215, for example, is an n-type work function metallic layer. In some embodiments, the gate electrodes G2, G4 include a second work function metallic layer 216 over the first work function metallic layer 215. The second work function metallic layer, for example, is a p-type work function metallic layer. The first and the second work function metallic layers 215, 216 can form a combined work function to adjust a work function value of the gate electrodes G2, G4.

The first work function metallic layer 215 can include materials such as metal, metal carbide, metal nitride, or other suitable materials. In some embodiments, the first work function metallic layer 215 can include materials such as hafnium, zirconium, titanium, tantalum, aluminum, metal carbides, other suitable materials, or the combinations thereof. In other embodiments, the first work function metallic layer 215 can include TiAl. The first work function metallic layer 215 is capable of providing a work function value of about 4.3 eV or less.

The second work function metallic layer 216 can include materials such as metal, metal carbide, metal nitride, other materials that can provide a desired work function for transistors. In some embodiments, the second work function metallic layer 216 can include a conductive metal, such as ruthenium, palladium, platinum, cobalt, nickel, conductive metal oxides, e.g., ruthenium oxide, other suitable materials, or the combinations thereof. In other embodiments, the second work function metallic layer 216 can include TiN. The second work function metallic layer 216 is capable of providing a work function value of about 5 eV or more.

In some embodiments, conductor structures 217 are formed over the gate electrodes G1, G2, G3, and G4. The conductor structures 217 can be configured to provide an electrical transmission. The conductor structures 217 can include structures, such as lines, bulks, plug, and/or other shape of structures. The conductor structures 217 can include metal (e.g. Al) or silicide such as nickel silicide (NiSi), nickel-platinum silicide (NiPtSi), nickel-platinum-germanium silicide (NiPtGeSi), nickel-germanium silicide (NiGeSi), ytterbium silicide (YbSi), platinum silicide (PtSi), iridium silicide (IrSi), erbium silicide (ErSi), cobalt silicide (CoSi), titanium silicide (TiSi), other suitable materials, and/or the combinations thereof.

Thereafter, the semiconductor device 200 continues with processing to complete fabrication as discussed briefly below. For example, a multilayer interconnection (MLI) including metal layers and inter-metal dielectric (IMD) is formed over the substrate to electrically connect various features or structures of the semiconductor device. The multilayer interconnection includes vertical interconnects, such as conventional vias or contacts, and horizontal interconnects, such as metal lines. The various interconnection features may implement various conductive materials including copper, tungsten and silicide. In one example, a damascene process is used to form copper multilayer interconnection structure.

In summary, the disclosed methods and integrated circuit devices result in improved device performance, including but not limited to, improved control over a surface roughness of the first dielectric layer in the I/O region by preventing the first dielectric layer in the I/O region being damaged during removal of the second dielectric layer in the device region. Further, a thickness of the first dielectric layer in the I/O region can be precisely controlled, which may simplify the process flow. It is understood that different embodiments may have different advantages, and that no particular advantage is necessarily required of any embodiment.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method comprising:
providing a substrate having a first region and a second region;
forming a first dielectric layer of a first material over the substrate in the first region;
forming a second dielectric layer of a second material over the substrate in the second region, wherein the second material is different from the first material;
forming a sacrificial gate layer over the first and second dielectric layers;
patterning the sacrificial gate layer, the first and second dielectric layers to form gate stacks in the first and the second regions;
forming an ILD layer over the gate stacks in the first and second regions;
partially removing the ILD layer in the first and second regions to expose the sacrificial gate layer;

removing the exposed sacrificial gate layer to define openings in the ILD layer in the first and second regions and expose the first dielectric layer and the second dielectric layer; and removing the second dielectric layer exposed in at least one of the openings in the ILD layer, removing the second dielectric layer comprising initiating an etching process on the exposed first dielectric layer and the exposed second dielectric layer, the etching process having high etching selectivity between the second dielectric layer and the first dielectric layer.

2. The method of claim 1, wherein the first region is an I/O region and the second region is a device region.

3. The method of claim 1, wherein the first dielectric layer is not substantially removed during removal of the second dielectric layer.

4. The method of claim 1, wherein the first material is silicon oxide.

5. The method of claim 1, wherein the second material is silicon nitride.

6. The method of claim 1, wherein forming the second dielectric layer in the second region is performed by a selective process, whereby the second dielectric layer is not formed in the first region.

7. The method of claim 6, wherein the selective process is a thermal process.

8. The method of claim 6, wherein the selective process is a furnace process, a rapid thermal annealing (RTA) process, or an in-situ steam generation (ISSG) process.

9. The method of claim 6, wherein the selective process is performed using a nitrogen-containing gas.

10. The method of claim 6, wherein the selective process is performed at a temperature ranging between about 300° C. and about 700° C. and under a pressure ranging between about 0.1 mTorr and about 10 mTorr.

11. The method of claim 1, wherein removing the second dielectric layer is performed using a phosphoric acid solution.

12. The method of claim 1, further comprising:
performing an annealing process after forming the second dielectric layer.

13. A method comprising:
providing a substrate having a device region and an I/O region;
forming a first dielectric layer over the substrate;
removing a portion of the first dielectric layer in the device region;
selectively forming a second dielectric layer over the substrate in the device region, wherein there is an etching selectivity between the first dielectric layer and the second dielectric layer;
forming a sacrificial gate layer over the first and second dielectric layers;
patterning the sacrificial gate layer, the first and second dielectric layers to form gate stacks in the device and I/O regions;
forming an ILD layer over the gate stacks in the device and I/O regions;
partially removing the ILD layer in the device and I/O regions to expose the sacrificial gate layer;
removing the exposed sacrificial gate layer to define openings in the ILD layer in the device region and the I/O region and expose the first dielectric layer in the I/O region and the second dielectric layer in the device region; and
removing the second dielectric layer exposed in at least one of the openings in the device region, wherein the first dielectric layer in the I/O region is not substantially removed during removal of the second dielectric layer, removing the second dielectric layer comprising initiating an etching process on the exposed first dielectric layer and the exposed second dielectric layer, the etching process having high etching selectivity between the second dielectric layer and the first dielectric layer.

14. The method of claim 13, wherein the first dielectric layer is thicker than the second dielectric layer.

15. The method of claim 13, wherein the first dielectric layer is silicon oxide and the second dielectric layer is silicon nitride.

16. The method of claim 13, wherein the etching selectivity among the second dielectric layer and the first dielectric layer ranges between about 80 and about 100.

17. The method of claim 13, wherein removing the second dielectric layer is performed by a wet etching process using a phosphoric acid solution.

18. The method of claim 13, further comprising performing an annealing process after forming the second dielectric layer.

19. The method of claim 18, wherein the annealing process is performed using an oxygen gas.

20. A method comprising:
providing a substrate having a device region and an I/O region;
forming an oxide layer over the substrate;
removing a portion of the oxide layer to expose the substrate in the device region;
selectively forming a nitride layer over the substrate in the device region;
forming a polysilicon layer over the oxide layer and the nitride layer;
patterning the polysilicon layer, the oxide layer and the nitride layer to form gate stacks in the device and I/O regions;
forming an ILD layer surrounding the gate stacks in the device and I/O regions and exposing the polysilicon layer;
removing the polysilicon layer to form openings in the ILD layer in the device and I/O regions;
removing the nitride layer in the openings in the ILD layer of the device region without substantially removing the oxide layer in the openings in the ILD layer of I/O region, removing the nitride layer comprising initiating an etching process on the exposed nitride layer and the exposed oxide layer, the etching process having high etching selectivity between the nitride layer and the oxide layer;
forming a high-k gate dielectric in the openings of device region and I/O region; and
forming a metal gate electrode over the high-k gate dielectric.

* * * * *